United States Patent [19]

Shimizu et al.

[11] Patent Number: 4,958,762

[45] Date of Patent: Sep. 25, 1990

[54] ULTRASONIC WIRE BONDER

[75] Inventors: Yasuhiko Shimizu; Hiroaki Kobayashi; Osamu Matsumoto, all of Yokohama, Japan

[73] Assignee: Kabushiki Kaisha Toshiba, Kawasaki, Japan

[21] Appl. No.: 398,438

[22] Filed: Aug. 25, 1989

[30] Foreign Application Priority Data

Aug. 25, 1988 [JP] Japan .................. 63-211423

[51] Int. Cl.⁵ .............................. B23K 20/10
[52] U.S. Cl. ...................... 228/1.1; 228/4.5
[58] Field of Search .................. 228/1.1, 4.5

[56] References Cited

FOREIGN PATENT DOCUMENTS 174732  8/1986  Japan ..................... 228/1.1
63-42855  8/1988  Japan .

Primary Examiner—Kenneth J. Ramsey
Attorney, Agent, or Firm—Foley & Lardner, Schwartz, Jeffery, Schwaab, Mack, Blumenthal & Evans

[57] ABSTRACT

An ultrasonic wire bonder includes first and second ultrasonic wave applying devices, the direction of vibration of the first ultrasonic wave being orthogonal to that of the second ultrasonic wave. One of the first and second ultrasonic waves or a composite ultrasonic wave thereof is applied to a capillary and/or a support base for wire bonding, depending upon the bonding direction along which a wire is extended, or the inner lead longitudinal direction. A unit for detecting the positions of a semiconductor chip and lead frame may be provided to adjust a position and control the ultrasonic wave to be applied.

5 Claims, 3 Drawing Sheets

ULTRASONIC WIRE BONDER

BACKGROUND OF THE INVENTION

The present invention relates to an ultrasonic wire bonder used in manufacturing semiconductor devices.

Ultrasonic wire bonders have been widely used particularly in the field of semiconductor devices. For example, a gold wire is bonded for connection between an inner lead of a lead frame and a bonding pad on a semiconductor chip die-bonded on the lead frame. Wire is generally bonded by using both ultrasonic bonding and heat-pressurized bonding.

In ultrasonic bonding, ultrasonic energy of approx. 60 kHz generated from an ultrasonic oscillator is propagated via an ultrasonic horn and a capillary to a gold wire so that an ultrasonic wave having an amplitude of 1 to 3 microns is applied to the gold wire. In heat-pressurized bonding, a heater mounted within a workpiece support base is raised to a temperature of about 200 to 250 degrees centigrade while a load about several tens to one hundred grams is applied through an ultrasonic horn.

Ultrasonic bonding, however, is associated with the following problems. An ultrasonic wave to be applied to a gold wire has directivity in that it is applied only in a direction parallel to an Y axis which is the longitudinal direction of an ultrasonic horn. Therefore, the bonding quality changes depending upon the bonding direction along which a gold wire is extended and upon the longitudinal direction of an inner lead of a lead frame. In the case of bonding a wire to a pad on a semiconductor chip, ultrasonic energy is propagated most efficiently if the bonding direction is parallel to the Y axis which is the direction of ultrasonic wave vibration. In the case of bonding a wire to an inner lead, ultrasonic energy is propagated most efficiently if the longitudinal direction of the inner lead is parallel to the Y axis.

Accordingly, ultrasonic energy is propagated sufficiently to a gold wire and an inner lead if both the bonding direction and the inner lead longitudinal direction are parallel to the Y axis, to thereby ensure a sufficiently high bonding force. On the other hand, if both the bonding direction and the inner lead longitudinal direction are orthogonal to the Y axis, ultrasonic energy is not propagated sufficiently to a gold wire and an inner lead so that a high bonding force cannot be obtained. As above, a bonding force fluctuates depending upon the bonding direction for bonding to the pad, and upon the inner lead longitudinal direction for bonding to the inner lead.

The bonding direction along which a gold wire is extended, is generally coincident with the inner lead longitudinal direction. However, both the directions become non-coincident with each other if an inner lead is mounted obliquely relative to the lead frame side. In such a case, the inner lead longitudinal direction is not coincident with the direction of ultrasonic vibration so that a sufficient bonding force cannot be obtained.

If the direction of ultrasonic vibration is not coincident with the bonding direction or the inner lead longitudinal direction, a bonding force becomes insufficient resulting in a problem of deteriorating reliability of semiconductor devices.

SUMMARY OF THE INVENTION

It is therefore an object of the present invention to provide an ultrasonic wire bonder capable of obtaining a uniform and sufficient bonding force even for a bonding site having a bonding direction or inner lead longitudinal direction different from the direction of ultrasonic vibration, and of improving the reliability of semiconductor devices.

According to one aspect of the present invention, there is provided an ultrasonic wire bonder for bonding a wire to a semiconductor chip and a lead frame respectively mounted on a workpiece support base, comprising first ultrasonic wave applying means for applying a first ultrasonic wave to the wire by propagating ultrasonic energy generated from an ultrasonic oscillator via an ultrasonic horn and capillary; and second ultrasonic wave applying means for applying a second ultrasonic wave to the workpiece support base, said second ultrasonic wave having the direction of vibration orthogonal to that of said first ultrasonic wave and the vibration energy of said second ultrasonic wave being controllable independently from said first ultrasonic wave applying means.

According to another aspect of the present invention, there is provided an ultrasonic wire bonder as defined in the first aspect, further comprising means for detecting the bonding positions of the semiconductor chip and the lead frame; means for calculating the direction along which the wire is extended and on the basis of the detected bonding positions; and control means for controlling said first and second ultrasonic wave applying means so as to make the calculated direction along which the wire is extended, coincide with the direction of vibration of a composite ultrasonic wave of the first and second ultrasonic waves.

The first ultrasonic wave applied to the wire by the first ultrasonic wave applying means has the direction of vibration orthogonal to that of the second ultrasonic wave applied to the lead frame and semiconductor chip by second ultrasonic wave applying means via the workpiece support base. The direction of a composite ultrasonic wave of the first and second ultrasonic waves can therefore be changed as desired in accordance with the bonding position.

Ultrasonic energy can be propagated sufficiently to a wire by making the direction of vibration of a composite ultrasonic wave of the first and second ultrasonic waves, coincide with the calculated direction of vibration along which the wire is extended.

Ultrasonic energy can also be propagated sufficiently to an inner lead via a capillary by making the direction of vibration of a composite ultrasonic wave of the first and second ultrasonic waves, coincide with the inner lead longitudinal direction.

The bonding positions on a semiconductor chip and lead frame can be identified using coordinates on an X-Y plane. For example, the position on a semiconductor chip is represented by (x1, y1), and the position of a lead frame is represented by (x2, y2).

With the ultrasonic wire bonder according to this invention, a bonding position, wherever it is located, can be applied with a uniform and sufficient bonding force, to thereby improve the reliability of semiconductor devices.

Further, the positions of a semiconductor chip and inner lead are detected to calculate the bonding direction and the inner lead longitudinal direction, and the ultrasonic wave applying means are controlled in accordance with the calculated data, to thereby supply a uniform and sufficient bonding force and improve the work efficiency.

DESCRIPTION OF THE PREFERRED EMBODIMENT

The embodiments of an ultrasonic wire bonder according to the present invention will now be described with reference to the accompanying drawings.

Figure 1:
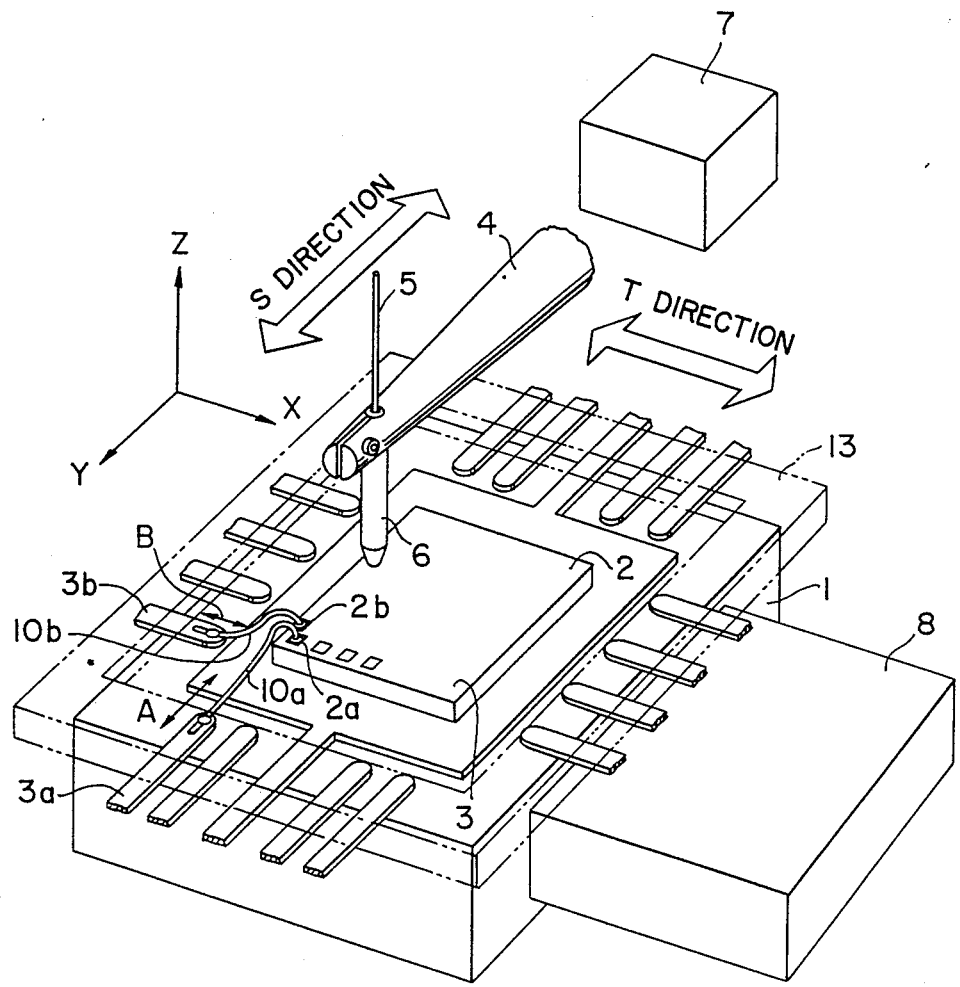
FIG. 1 is a perspective view showing an embodiment of an ultrasonic wire bonder according to the present invention.

FIG. 1 shows a first embodiment of the ultrasonic wire bonder according to the present invention. The wire bonder has a workpiece support base 1 on which a lead frame 3 is placed, and a frame setter 13 having a center opening for setting the lead frame 3 in position. An ultrasonic horn 4 extends from the outside towards the central area of the workpiece support base 1, the tip of the horn being mounted with a capillary 6. A fine aperture is formed at the center of the capillary 6 throughout the whole length thereof so that a gold wire 5 can be guided into the aperture.

An ultrasonic oscillator 7 is coupled to the ultrasonic horn 4 to generate ultrasonic vibration in the longitudinal direction S of the ultrasonic horn.

In this embodiment, another ultrasonic wave oscillator 8 is coupled to the workpiece support base 1. The ultrasonic wave oscillator 7 applies an ultrasonic wave (called a first ultrasonic wave) to the gold wire 5 via the ultrasonic wave horn 4 and capillary 6, whereas the ultrasonic wave oscillator 8 coupled to the workpiece support base 1 applies an ultrasonic wave (called a second ultrasonic wave), the direction T of vibration being orthogonal to the first ultrasonic wave, to the leadframe and semiconductor chip 2 via the workpiece support base 1. The ultrasonic wave oscillator 7 and ultrasonic wave horn 4 constitute first ultrasonic applying means, and the ultrasonic wave oscillator 8 coupled to the workpiece support bas 1 constitutes a second ultrasonic wave applying means.

Wire bonding by using the wire bonder constructed as above will be described. Assuming that a pad 2a and an inner lead 3a are to be interconnected, the bonding direction along which the gold wire 5 is extended and the longitudinal direction (direction A) of the inner lead 3a are both parallel to the Y axis. In this case, the first ultrasonic wave is applied to the gold wire 5 to wire-bond the pad 2a and the inner lead 3a. Ultrasonic energy is therefore sufficiently propagated for obtaining a large bonding force.

Alternatively, assuming that a pad 2b and an inner lead 3b are to be interconnected, the bonding direction and the longitudinal direction (direction B) of the inner lead 3b are both orthogonal to the Y axis. In this case, the second ultrasonic wave from the ultrasonic wave oscillator 8 coupled to the workpiece support base is applied to the lead frame 3 and semiconductor chip 2 to wire-bond the pad 2b and inner lead 3b.

If the bonding direction and the inner lead longitudinal direction are neither parallel to nor orthogonal to the Y axis, a composite ultrasonic wave of the first and second ultrasonic waves is applied while making the direction of the composite ultrasonic wave coincide with the bonding direction or inner lead longitudinal direction.

According to this embodiment, the wire bonder is provided with a first and a second ultrasonic wave applying means, the directions of vibration of which are orthogonal to each other. One of the ultrasonic waves or a composite ultrasonic wave thereof is used depending upon the bonding direction or the inner lead longitudinal direction, to thereby ensure a uniform and sufficient bonding force at any bonding position.

Figure 2:
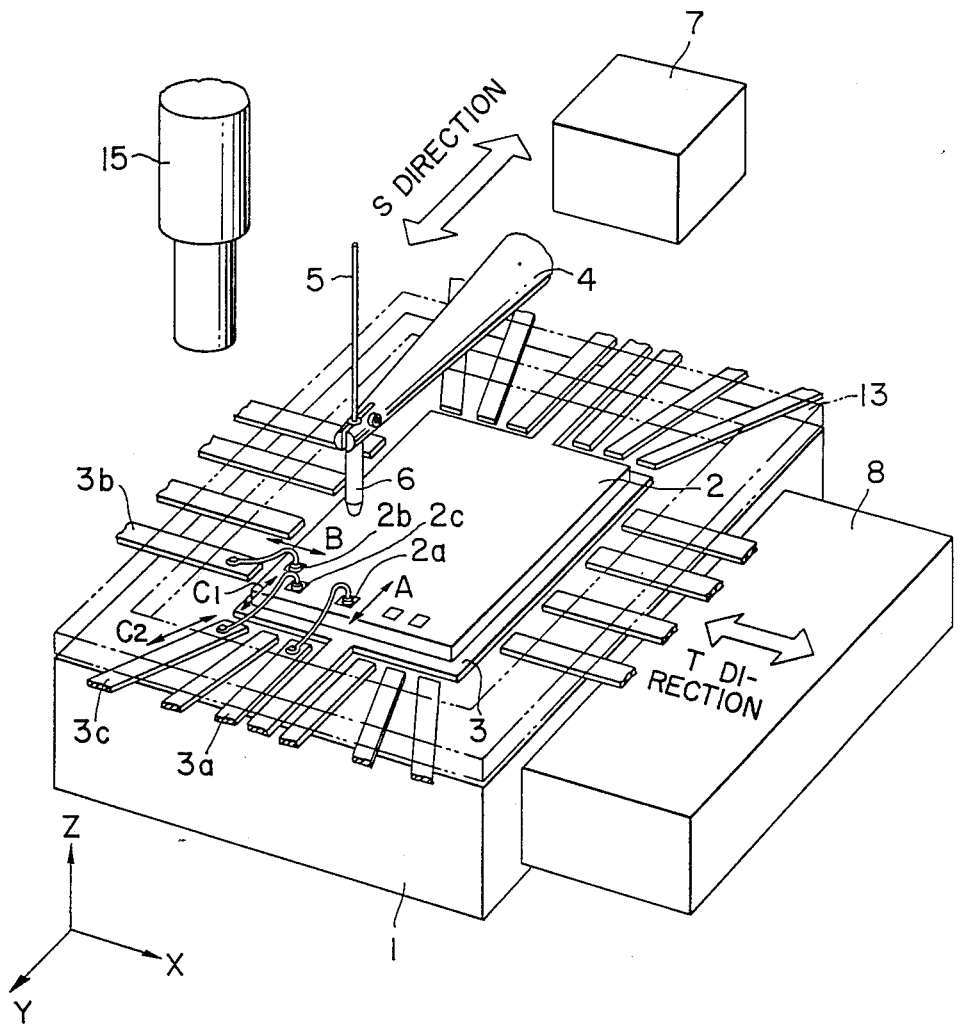
FIG. 2 is a perspective view showing another embodiment of an ultrasonic wire bonder according to the present invention.

FIG. 2 shows the second embodiment of the ultrasonic wire bonder according to the present invention. In the second embodiment as different from the first embodiment, a bonding position is detected with a workpiece position detection camera 15, and the first and second ultrasonic applying means are controlled in accordance with the detected position so as to apply an ultrasonic wave having an optimum amplitude, frequency and phase.

Figure 3:
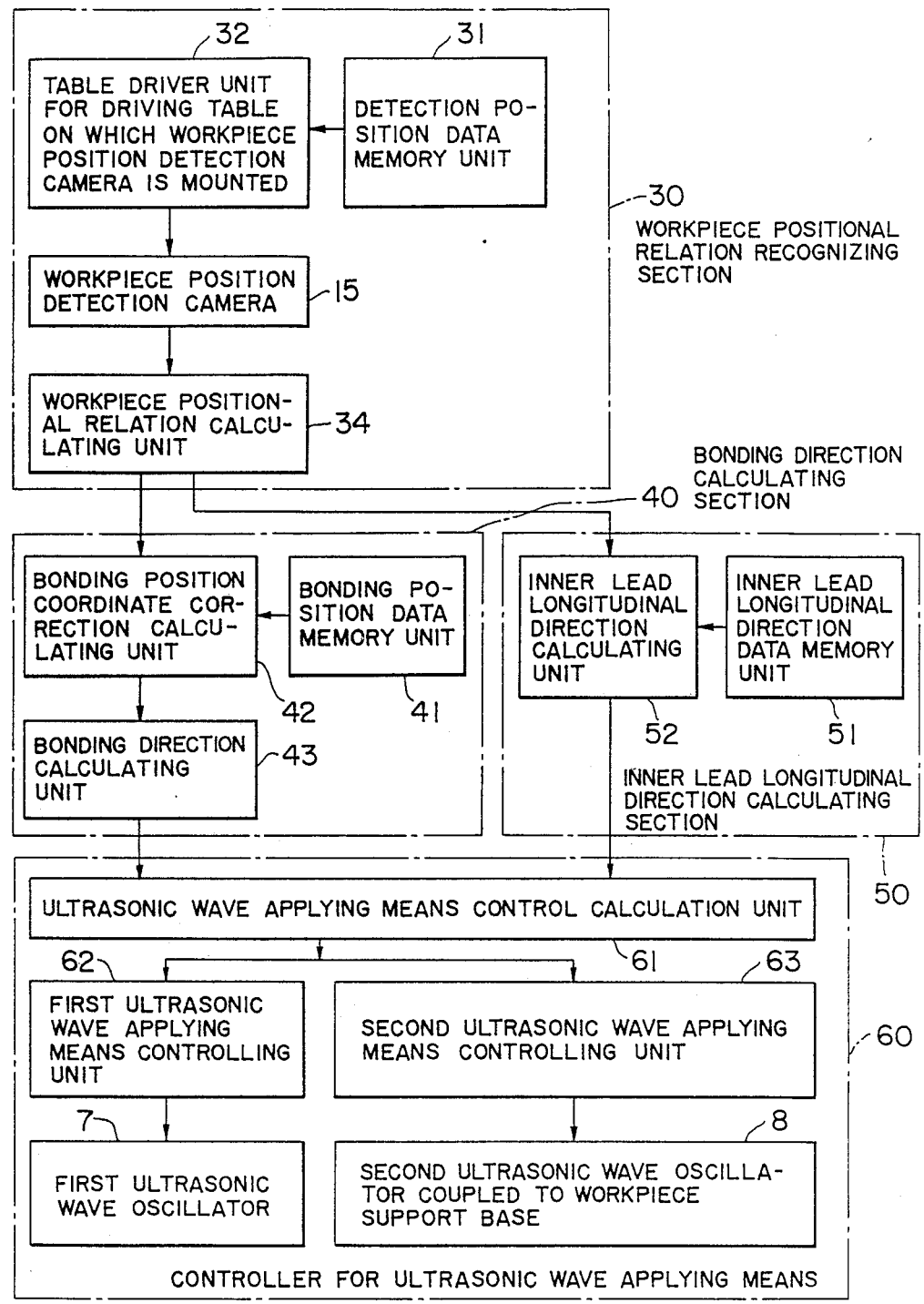
FIG. 3 is a block diagram showing the structure of a control system used with the embodiment shown in FIG. 2.

FIG. 3 is a block diagram showing the control system for the ultrasonic wire bonder shown in FIG. 2. This control system includes as the main sections: a workpiece positional relation recognizing section 30 for detecting the positional relation between a pad and an inner lead to be interconnected; a bonding direction calculating section 40 for calculating a bonding direction in accordance with the detected positional relation between a pad and an inner lead; an inner lead longitudinal direction calculating section 50 for calculating an inner lead longitudinal direction; and a controller 60 for controlling the first and second ultrasonic wave applying means in accordance with the calculated bonding direction or inner lead longitudinal direction.

The operation of this embodiment will be described. Assuming that a bonding pad 2c and an inner lead 3c extending obliquely in a C1 direction are to be wire-bonded. The bonding direction C2 is not coincident with the C1 direction.

Detection position data are previously stored in a detection position data memory unit 31 of the workpiece positional relation recognizing section 30 in accordance with CAD (Computer Aided Design) data or drawing data. In accordance with the detection position data, a table driver unit 32 drives an X-Y table on which a workpiece position detection camera 15 as well as the ultrasonic wave horn 4 are mounted, to thereby move the camera 15 to a detection position. The positions of the semiconductor chip 2 and lead frame 3 are detected with the camera 15. For example, two points on the semiconductor chip 2 or lead frame 3 are detected. The displacement and inclination between the detected positions and the detection position data stored in the memory unit 31 are calculated at a workpiece positional relation calculating unit 34.

Next, in the bonding direction calculating section 40, a bonding position coordinate correction calculating unit 42 corrects, while referring to the calculated position data, bonding position data (data representative of connection relation between semiconductor chip 2 and lead frame 3) previously stored in a bonding position data memory unit 41 based on CAD data or the like. The corrected bonding position data are used for calculating the bonding direction at a bonding direction calculating unit 43. For example, by representing the pad position on the semiconductor chip as (x1, y1) and the inner lead position on the lead frame 3 as (x2, y2), the bonding direction can be expressed as $\theta = \tan^{-1}$ (y2 - y1)/(x2 - x1).

Data representative of the inner lead longitudinal direction are previously stored in an inner lead longitudinal direction data memory unit 51 based on CAD data or the like. An inner lead longitudinal direction calculating unit 52 corrects the longitudinal direction data while referring to the inner lead position data obtained at the workpiece positional relation calculating unit 34.

Next, the controller 60 controls the first and second ultrasonic wave applying means so as to make the direction of vibration of a composite ultrasonic wave of the first and second ultrasonic waves, coincide with the obtained bonding direction or inner lead longitudinal direction. For example, by representing the first ultrasonic wave as $y1 = A\sin(\omega_1 t + a_1)$ and the second ultrasonic wave as $y2 = B\sin(\omega_t + a_2)$, the direction of vibration of the composite ultrasonic wave can be expressed as:

$$\theta = \tan^{-1}\{B\sin(\omega_2 t + a_1)\}$$

The bonding direction is aligned to this vibration direction for wire bonding to a pad on the semiconductor chip 2, whereas the inner lead longitudinal direction is aligned to it for wire bonding to an inner lead.

In the controller 60 for ultrasonic wave applying means, an ultrasonic wave applying means control calculating unit 61 calculates the amplitude, phase and frequency of an ultrasonic wave to be generated from each of the first and second ultrasonic wave applying means. The calculated data are supplied to first and second ultrasonic wave applying means controlling units 62 and 63. The first ultrasonic applying means controlling unit 62 controls the first ultrasonic wave oscillator 7 serving as first ultrasonic wave applying means, and the second ultrasonic wave applying means controlling unit 63 controls the second ultrasonic oscillator 8 coupled to the workpiece support base serving as second ultrasonic wave applying means.

As described above, in the second embodiment, the positions of a semiconductor chip and a lead frame are detected, and the direction of vibration of an ultrasonic wave is aligned to the bonding direction if a pad is wire-bonded, whereas it is aligned to the inner lead longitudinal direction if an inner lead is wire-bonded. A uniform and sufficient bonding force is therefore obtained at any bonding position. In addition, the ultrasonic wave applying means is controlled upon automatic detection of the position of a workpiece so that the work efficiency is improved.

In the second embodiment, the direction of vibration of a composite ultrasonic wave of the first and second ultrasonic waves is aligned to the bonding direction for bonding to a pad, and to the inner lead longitudinal direction for bonding to an inner lead. In this connection, since the longitudinal direction (A, B direction) substantially coincides with the bonding direction in most cases, if there is no oblique inner lead shown in FIG. 2, it is possible to use first ultrasonic wave applying means only for wire bonding in the A direction, and second ultrasonic wave applying means only for wire bonding in the B direction. Furthermore, although the workpiece position is detected using the coordinates on an X-Y plane, other coordinate systems such as a polar coordinate system may also be used. Still furthermore, not only ultrasonic bonding but also heat-pressurized bonding may be used.

What is claimed is:

1. An ultrasonic wire bonder for bonding a wire to a semiconductor chip and a lead frame respectively mounted on a workpiece support base, comprising:

first ultrasonic wave applying means for applying a first ultrasonic wave to the wire by propagating ultrasonic energy generated from an ultrasonic oscillator via an ultrasonic horn and capillary; and second ultrasonic wave applying means for applying a second ultrasonic wave to the workpiece support base, said second ultrasonic wave having the direction of vibration orthogonal to that of said first ultrasonic wave and the vibration energy of said second ultrasonic wave being controllable independently from said first ultrasonic wave applying means.

2. An ultrasonic wire bonder according to claim 1, further comprising:

means for detecting the bonding positions of the semiconductor chip and the lead frame;

means for calculating the direction along which the wire is extended, based on the detected bonding positions; and control means for controlling said first and second ultrasonic wave applying means so as to make the calculated direction along which the wire is extended, coincide with the direction of vibration of a composite ultrasonic wave of the first and second ultrasonic waves.

3. An ultrasonic wire bonder according to claim 2, further comprising:

means for storing data representative of a direction of each inner lead of the lead frame; and said control means controlling said first and second ultrasonic wave applying means so as to make the inner lead longitudinal direction, coincide with the direction of vibration of a composite ultrasonic wave of the first and second ultrasonic waves, in accordance with said data.

4. An ultrasonic wire bonder according to claim 2, wherein said bonding position detection means detects the bonding positions of the semiconductor chip and lead frame by using the coordinates on an X-Y coordinate system.

5. An ultrasonic wire bonder according to claim 4, wherein said bonding position detection means includes a workpiece position detection camera.

* * * * *